(12) United States Patent
Pflum (10) Patent No.: US 8,136,409 B2
(45) Date of Patent: Mar. 20, 2012

(54) PERFORMING METERING USING PULSE COUNTING

(75) Inventor: Marty Lynn Pflum, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 109 days.

(21) Appl. No.: 12/790,466

(22) Filed: May 28, 2010

(65) Prior Publication Data

US 2011/0290036 A1    Dec. 1, 2011

(51) Int. Cl.
*G01F 1/56* (2006.01)
(52) U.S. Cl. .................................................. 73/861.08
(58) Field of Classification Search ............... 73/462, 73/464, 861.08
See application file for complete search history.

(56) References Cited

U.S. PATENT DOCUMENTS

| 3,806,904 | A | * | 4/1974 | Weinberger et al. ...... 340/870.02 |
| 3,922,492 | A | * | 11/1975 | Lumsden ................. 379/106.07 |
| 4,046,017 | A | * | 9/1977 | Hill ................................ 73/462 |

OTHER PUBLICATIONS

Texas Instruments, "Using GMR Sensors With the MSP430 Scan Interference," Application Report, SLAA358—Apr. 2007, pp. 1-20.

* cited by examiner

*Primary Examiner* — Jewel V Thompson
(74) *Attorney, Agent, or Firm* — Trop, Pruner & Hu, P.C.

(57) ABSTRACT

An apparatus can include a first detector to receive a first signal from a first switch configured to open and close based on position of a metering wheel associated with a flow line. The apparatus can further include a first counter to count within a first range based on a change in a state of the first signal. Using this information, the apparatus can determine usage and direction of, e.g., a fluid or liquid flowing along the flow line.

21 Claims, 10 Drawing Sheets

SINGLE
FORM A

FIG. 7A

DUAL MODE

PERFORMING METERING USING PULSE COUNTING

BACKGROUND

To appropriately charge consumers for utility usage such as gas, water, or electricity, a metering device is associated with the utility connection. Historically, the metering device has been a mechanical device that is located at the utility connection. This mechanical device requires utility personnel to manually read the device, typically monthly, which can be a significant expense for the utility.

Accordingly, some metering devices provide for some type of communication of the metered information to the utility. Nevertheless, most metering devices are mechanical in nature. While some electrical-based devices are entering the market, their architectures are typically still based on mechanical detection of consumption.

SUMMARY OF INVENTION

According to one aspect of the present invention, an apparatus that can be used for metering flow on a line can be configured with a pulse counter architecture to enable a semiconductor-based metering system. In one implementation, the apparatus can include a first detector to receive a first signal from a first switch configured to open and close based on position of a metering wheel associated with a flow line and a second detector to receive a second signal from a second switch configured to open and close based on the metering wheel position. The apparatus can further include multiple counters, including a first counter to count within a first range based on a change in a state of at least one of the first and second signals in a first direction and a second counter to count within a second range based on a state change in a second direction. Using this information, the apparatus can determine usage and direction of, e.g., a fluid or liquid flowing along the flow line.

To provide for low power operation, some embodiments may include a wake circuit to cause a controller to wake up when at least one of the first and second counters reaches an end of its range. This controller may increment a stored value to update a consumption level of the substance when the first counter reaches its range end and to reset the first counter, and to cause the controller to enter a sleep state. To enable counting operations to be performed accurately, embodiments may include debounce circuitry coupled between the detectors and the counters. Such circuitry may include a programmable integrator to enable a level detection of the signals if a given number of samples of the corresponding signal at a given level have occurred during a sample period.

While embodiments can be implemented in many different types of systems, some embodiments may be implemented in an integrated circuit having a first die including the first and second detectors and the first and second counters, and a second die including a radio circuit to couple with an antenna to wirelessly communicate metering information received from the first die.

Another aspect of the present invention is directed to a method for receiving a first signal in a metering circuit from a first switch associated with a metering wheel associated with a flow line, determining whether the first signal has transitioned from a first to second state, and updating a first counter of the metering circuit responsive to a control signal. In one implementation, the control signal may be received from a state machine for an operation mode of the metering circuit, and may be based at least in part on the transition. In some implementations, a second signal can be received from a second switch associated with the metering wheel, and is based on determination of a transition of this signal, the counter can be updated in a first direction if the transition in at least one of the two signals indicates clockwise movement of the metering wheel.

Yet another aspect of the present invention is directed to a meter system. This system, which can be located with respect to a utility connection, can provide for metering of a utility line and communication of metering information to a remote entity, e.g., via wireless communication.

In one embodiment, the system includes a metering circuit having a first detector to receive a first signal from a first switch configured to open and close based on position of a metering wheel to output a first detection signal, a logic unit to receive the first detection signal, generate a first control signal based on a state of the first detection signal, and provide the first control signal to a first counter to update a first count responsive to the first control signal. The circuit can further include a controller to update a metering count when the first counter reaches an end of its range. In turn, a radio circuit can be coupled to the metering circuit to communicate control information to the metering circuit and to receive metering information from the metering circuit such as the metering count. When installed in the field, the radio circuit is coupled to an antenna to enable wireless transmission of the metering information to a metering agent.

DETAILED DESCRIPTION

In various embodiments, a metering system may be provided to enable high performance metering at low power. In this way, usage and direction of a fluid or gas such as residential water or gas metering can be determined. However, embodiments may also apply to other uses such as industrial metering. In some embodiments an elongated magnet on a metering wheel passes over reed switches and causes one or more switches to open or close at various times. In a two switch implementation, this creates a plurality of states: closed-closed (e.g., 00), closed-open (e.g., 01), open-closed (e.g., 10), and open-open (e.g., 11). Using the transitions between the various states, both direction and rate of flow can be determined (based on transition counts).

Figure 1:
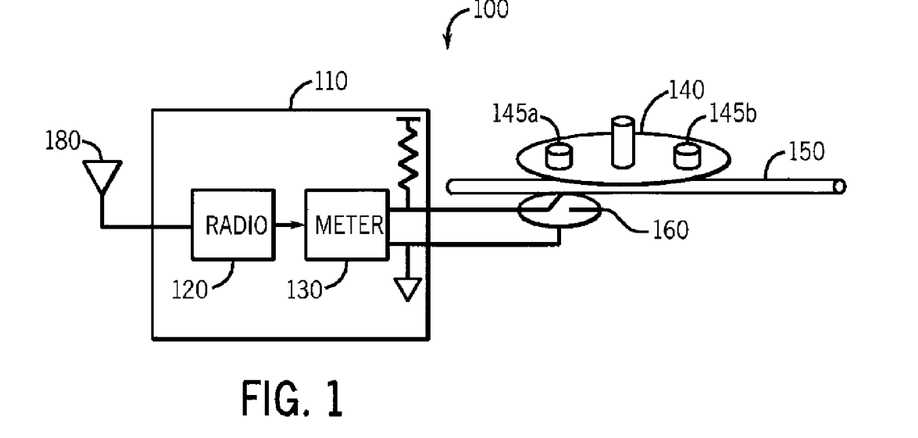
FIG. 1 is a block diagram of a metering system in accordance with one embodiment of the present invention.

Referring now to FIG. 1, shown is a block diagram of a metering system in accordance with one embodiment of the present invention. As shown in FIG. 1, system 100 may be used to meter flow along a fluid line 150. As examples, this fluid line may be a residential gas or water line. In other embodiments, the flow line may be present in an industrial setting, e.g., a gas or liquid line of industrial machinery such as may be present in oil refineries, chemical processing plants or so forth. To monitor the flow of a transported substance through flow line 150, a metering wheel 140 may be associated with flow line 150 such that it rotates in accordance with passage of the transported substance through the line. In some implementations, the wheel may be configured to rotate one full revolution per a given volume of substance. For example, one revolution of the wheel may occur when a cubic foot, yard or other measured volume passes through the metered point of the flow line. As further seen in FIG. 1, one or more magnets $145_a$ and $145_b$ may be configured on the wheel to cause opening and closing of a switch 160. In various embodiments, switch 160 may be any type of switch. In some implementations, the switch may be a given type of reed switch that open or closed when one of the corresponding magnets 145 passes over the reed switch, which includes a magnetic material to enable the actuation due to the magnetic field generated.

To enable metering operations to occur, reed switch 160 is coupled to a metering device 110. In various embodiments, metering device 110 may be implemented as an integrated circuit, e.g., a semiconductor package including one or more semiconductor die. The metering system may be implemented as multi-chip module package including a radio that is associated with an antenna. For example, in one implementation the semiconductor die may be fabricated according to a CMOS process. In the implementation shown in FIG. 1, two individual die are present, namely a first die 120 and a second die 130. First die 120 may be a single chip radio device to enable wireless communication with a remote location. For example, the information to be communicated may be metering information determined in metering device 110. In turn, second die 130 may include metering circuitry to receive information from switch 160 and perform various operations and calculations to determine a metered amount of transported substance passing through flow line 150. In various implementations, the information determined in metering circuitry 130 can be communicated to radio die 120 to enable its wireless transmission via an antenna 180.

In various embodiments, the radio die may be a short-range radio transceiver to enable transmission and receipt of radio frequency (RF) signals in a relatively short range, e.g., hundreds of feet. In this way, residential line metering can occur by having a vehicle travel residential streets and communicate with metering devices present at each residential location, enabling more efficient meter reading, reducing costs for a utility or other entity. In other implementations, ZigBee™ or other peer networks can be provided to communicate from chip-to-chip and thus communicate farther distances, e.g., back to a utility location. Such operation may be used to communicate a backflow alarm.

While shown with this particular implementation in the embodiment of FIG. 1, the scope of the present invention is not limited in this regard. For example, FIG. 1 shows an implementation including a single switch 160. As will be described further below, in other implementations multiple switches can be provided in a metering system to enable both measurement of flow through a metered line and determination of direction of flow. Furthermore, while the circuitry of the metering device can vary in different implementations, to enable determination of both flow volume and direction, embodiments may implement multiple metering pulse counters with the metering circuitry.

Figure 2:
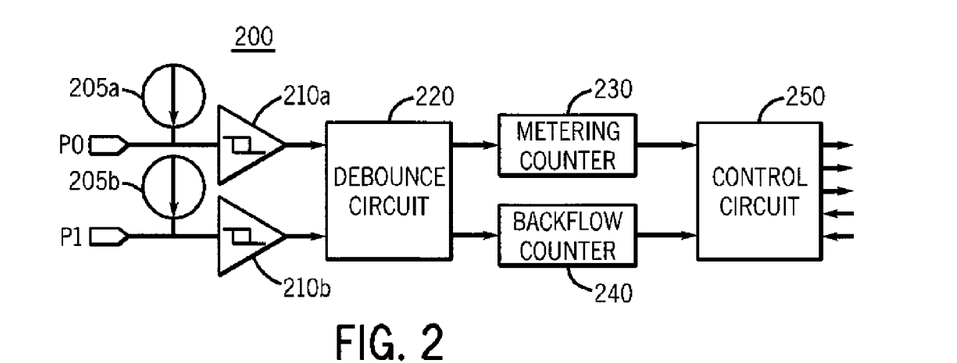
FIG. 2 is a block diagram of a metering circuit in accordance with one embodiment of the present invention.

Referring now to FIG. 2, shown is a block diagram of a metering circuit 200 in accordance with one embodiment of the present invention. Metering circuit 200 may correspond to the second die 130 shown in FIG. 1. In general, metering circuit 200 includes parallel paths to enable pulse counting to occur for use in processing metering information and to process back flow or direction information.

As seen in FIG. 2, circuit 200 includes parallel paths, each configured to receive a signal from one or more switches (not shown for ease of illustration in FIG. 2). Namely, a primary path receives a first signal (P0) while a secondary path receives a second signal (P1). These signals are provided to a corresponding detector $210_a$ and $210_b$ which in one embodiment may be configured as Schmitt triggers. The Schmitt triggers may act as level detectors, and via hysteresis provide a level of noise immunity as a filtering operation. To enable different modes of operation, each path may have a corresponding pull up circuit $205_a$ and $205_b$ coupled thereto. As will be discussed further below, these pull up circuits may be programmably controlled to be enabled or disabled based on a desired mode of operation. In addition, controllable values of pull up impedance may be provided by each of these pull up circuits. In general, each pull up circuit 205 may be coupled between a supply voltage node and a corresponding metering path line.

Still referring to FIG. 2, the outputs of the Schmitt triggers are provided to a debounce circuit 220. In different embodiments, debounce circuit 220 may include various circuitry to enable detection of state changes occurring in the received signal and to generate control signals for one or more pulse counters via state machines for each available operation mode (also generally present in debounce circuit 220). In general, the debounce circuitry may include debounce logic, state machines and so forth to enable one or more outputs that correspond to a control signal that indicates a change in logic states of the received signal(s).

In turn, the control signal outputs each may be provided to a corresponding counter. For the primary path, a metering counter 230 may receive a first output of debounce circuit 220. In one embodiment, metering counter 230 may be implemented as a 16 bit down counter configured to count within a predetermined range (e.g., from $FFFF_H$ to $0000_H$), where the pending count is decremented when a given transition (e.g., a downward transition) is detected. For example, for each revolution of a metering wheel, a reed switch may switch states, triggering a logic change in the output signal and in turn a decrement of metering counter 230 may occur. In some implementations, the counters may increment or decrement multiple times per revolution of the wheel.

When the metering counter reaches the end of its range, an output from counter 230 may be provided to a wake up and control circuit 250 (hereafter control circuit). As will be discussed further below, in general such circuitry may trigger a wake up of additional circuitry within metering device 200 to enable, e.g., a value (such as may be present in another counter or stored in a memory, e.g., a static RAM) to be incremented to indicate that a given amount of transported substance has flowed through the metered line. Then, the control circuitry may cause this additional circuitry to re-enter a sleep state and to cause the metering counter 230 to be reset to its initial count value.

Similar operations may occur with regard to back flow counter 240. However, the back flow counter may be configured differently. For example, back flow counter 240 may be an 8 bit down counter configured to count within a predetermined range (e.g., from $FF_H$ to $00_H$) that is configured to count down for every logic transition that indicates backwards flow through the line. Accordingly, for each revolution of a metering wheel in a backwards direction, back flow counter 240 may be updated, e.g., by a decrement. When this counter reaches the end of its predetermined range, it may output a signal to wakeup control circuit 250 to enable communication of a backflow alarm. For example, in another embodiment both counters may be implemented as incrementing counters regardless of direction of the flow. In one such embodiment, the counters may both be configured as 24-bit incrementing counters with one counter for clockwise flow and the second counter for counter-clockwise flow. While shown with this particular implementation with respect to FIG. 2, understand the scope of the present invention is not limited in this regard.

Different configurations of control switches to cause generation of signals to be provided to a metering device can be made in different implementations. The selection of a given type of switch to use can be based on various considerations, including type of installation, relative size and cost of switches, amount of power consumed and so forth. For example, for residential installations, it may be desirable to provide a metering system with a long-life battery (e.g., lasting 10-20 years). To enable such long lifetime, minimal power consumption may be desired. Accordingly, selection and control of switches for a metering system can be made in this manner.

Figure 3A:
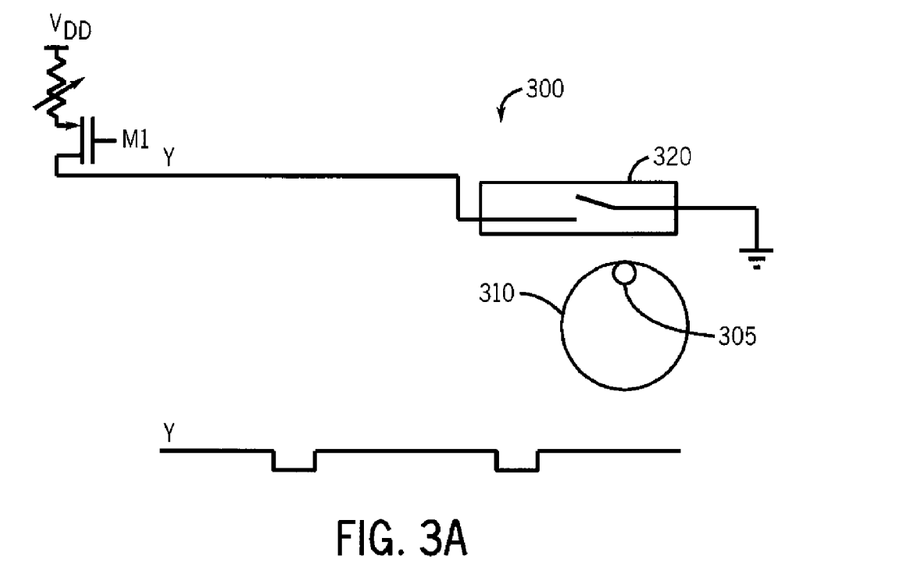
FIG. 3A is a schematic diagram and associated timing illustration of a switch arrangement in accordance with one embodiment of the present invention.

Referring now to FIG. 3A, shown is a schematic diagram and associated timing illustration of a switch arrangement in accordance with one embodiment of the present invention. As shown in FIG. 3A, arrangement 300 includes a form A reed switch 320 which as seen is a single pole single throw (SPST) normally open switch. As seen, switch 320 may be located in close proximity to a metering wheel 310 that includes at least one magnet 305. When magnet 305 comes in close contact to switch 320, the normally open switch may close. Thus as seen, a signal Y, which may be provided to a metering circuit such as metering circuit 210 of FIG. 2, is typically at a high level, and drops to a low level when magnet 305 is in close proximity to switch 320. As further seen in FIG. 3A, a pullup impedance PU1, which in one embodiment may be a controllable resistance, is coupled between a supply voltage node ($V_{dd}$) and the signal output line via a controllable switch, e.g., a metal oxide semiconductor field effect transistor (MOSFET), e.g., a PMOS device (M1). As further seen in FIG. 3A, the timing diagram illustrates that the output signal Y may normally be at a high level, and drops to a low level based on the proximity of magnet 305 to switch 320.

Figure 3B:
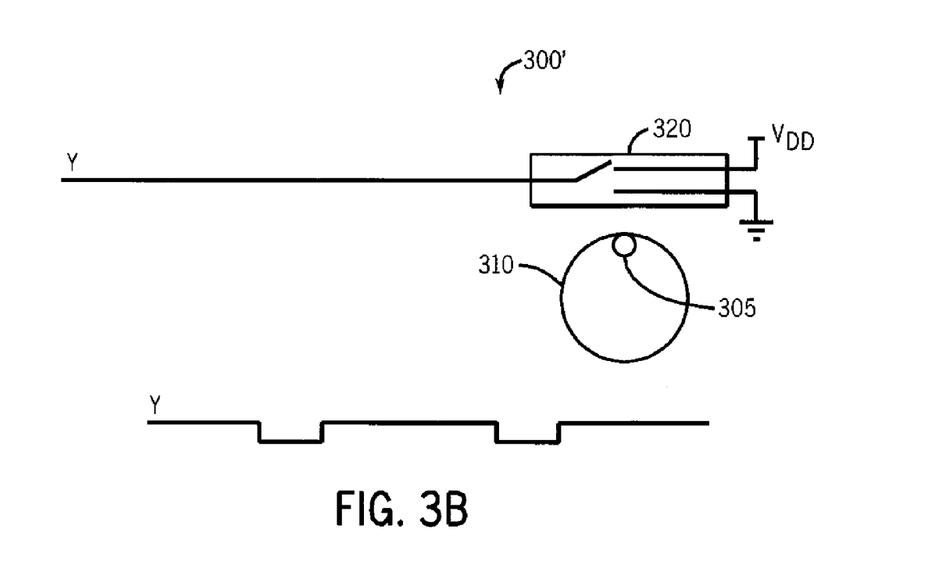
FIG. 3B is a schematic diagram and associated timing illustration of a switch arrangement in accordance with another embodiment of the present invention.

In other implementations, a different type of switch such as a form C switch may be used instead. Referring now to FIG. 3B, shown is an arrangement 300' in which switch 320 is a form C reed switch, which as seen may be a single pole double throw (SPDT) switch. Note here there is no pull up circuit present. That is, although a metering circuit may include such a pull up circuit, for an implementation such as that shown in FIG. 3B the circuit may be disabled or switched off. In this implementation, the output signal Y may be normally high. Note however, that a longer low level occurs in the signal. This is due to the break before make arrangement of switch 320 such that the normally closed connection to $V_{dd}$ is broken before switch 320 couples to its ground connection. Thus this implementation may be thought of as a form A functionality using a form C switch. Both of the above arrangements may be referred to as a "single" mode operation, as only a single output signal is provided from the arrangement to a metering circuit.

Figure 4:
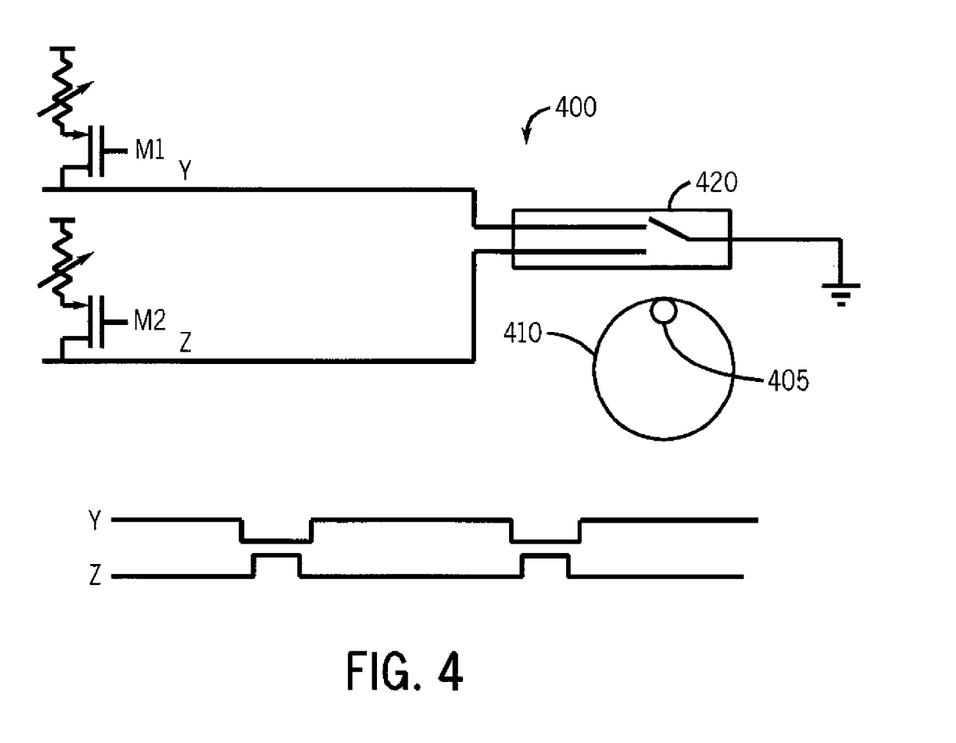
FIG. 4 is a schematic diagram and associated timing illustration of a switch arrangement in accordance with yet another embodiment of the present invention.

In other implementations, rather than having a single output line from a switch to a metering circuit, multiple output lines may be provided. Referring now to FIG. 4, shown is a schematic diagram of an arrangement in accordance with yet another embodiment of the present invention, namely a "dual" mode arrangement. As shown in FIG. 4, arrangement 400 includes a metering wheel 410 with an associated magnet 405 that is configured in proximity to a switch 420 which in various embodiments may be a form C reed switch. The pull up circuit in one implementation can use controllable resistors which are switched on/off by pulsing devices (e.g., PMOS devices M1 and M2 as shown in FIG. 4). As seen, the timing diagram illustrates that in normal operation on the first output line signal Y is normally high and goes low when magnet 405 is in close contact to switch 420, while in contrast signal Z on the second output line is normally low and goes high when the magnet is in close contact to the switch. Note that in this implementation of a single form C switch, although there are two output signal lines, no direction information is available.

Figure 5A:
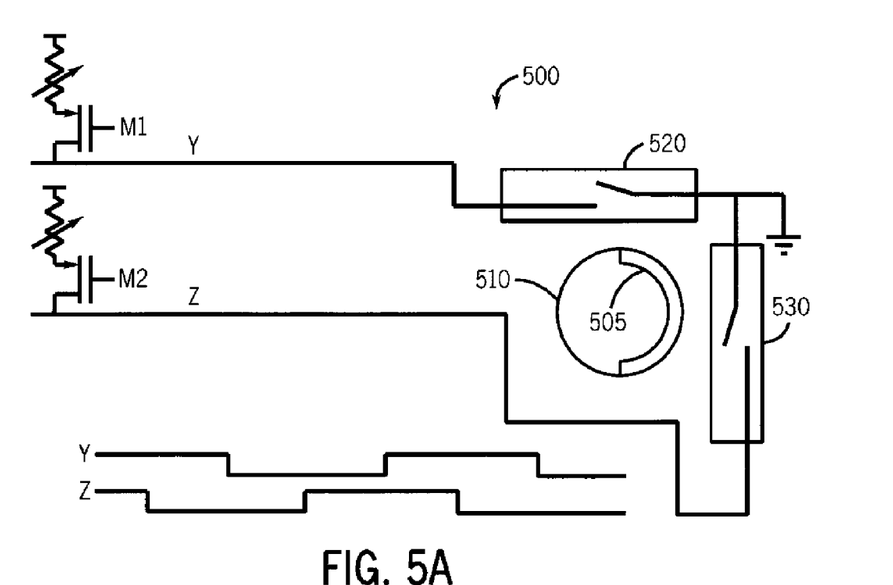
FIG. 5A is a schematic diagram and associated timing illustration of a switch arrangement in accordance with another embodiment of the present invention.

In yet other implementations, to obtain direction information in addition to flow information, embodiments may provide for multiple switches to be present. Referring now to FIG. 5A, shown is an arrangement 500 in which a pair of switches 520 and 530 are associated with a metering wheel 510 that includes a magnet 505. In the implementation shown in FIG. 5A, both switches are form A switches. Each switch is coupled to an output signal line that has a pull up circuit coupled between the line and a supply voltage node. As seen in the timing diagram of FIG. 5A, this quadrature circuit thus provides two output signals that can be used for both flow and direction information. As shown in the timing diagram, it is possible to attain four states from these two lines, namely high-high (HH), high-low (HL), low-high (LH) and low-low (LL). Based on the information provided through these four states, embodiments can determine both metering and direction information. Some implementations with long lines Y and Z have large capacitances and stronger pull ups. More power will be burned when the switch is in the closed position due to the AC path to ground.

In one embodiment, an auto calibration may be performed to identify an appropriate pull up resistance to charge the line. In one embodiment, the calibration may first check that a maximum pull up setting works. Then the calibration steps from low to high pull up values until a lowest strength pull up that will charge the line to a given current level in a predetermined time, e.g., 1 ms, is determined. In one calibration procedure, the line may be discharged, charged for several cycles, wait for the charge to settle, and read the result (e.g., current on the line). This sequence may then continue from lowest to highest order of impedance level until the lowest strength that works is found.

Figure 5B:
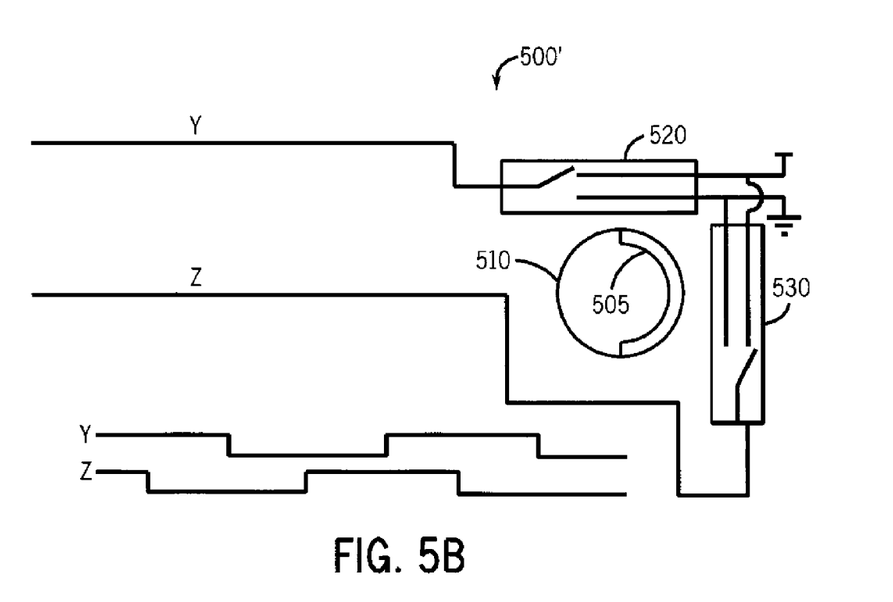
FIG. 5B is a schematic diagram and associated timing illustration of a switch arrangement in accordance with another embodiment of the present invention.

Accordingly, to reduce power consumption an implementation such as shown in FIG. 5B may be realized. In arrangement 500' of FIG. 5B, switches 520 and 530 may be form C type switches. In this way, the need for pull up circuits can be avoided, potentially reducing power consumption. In other respects, the operation and timing of the output signals from arrangement 500' may be the same as arrangement 500, discussed above.

Figure 6:
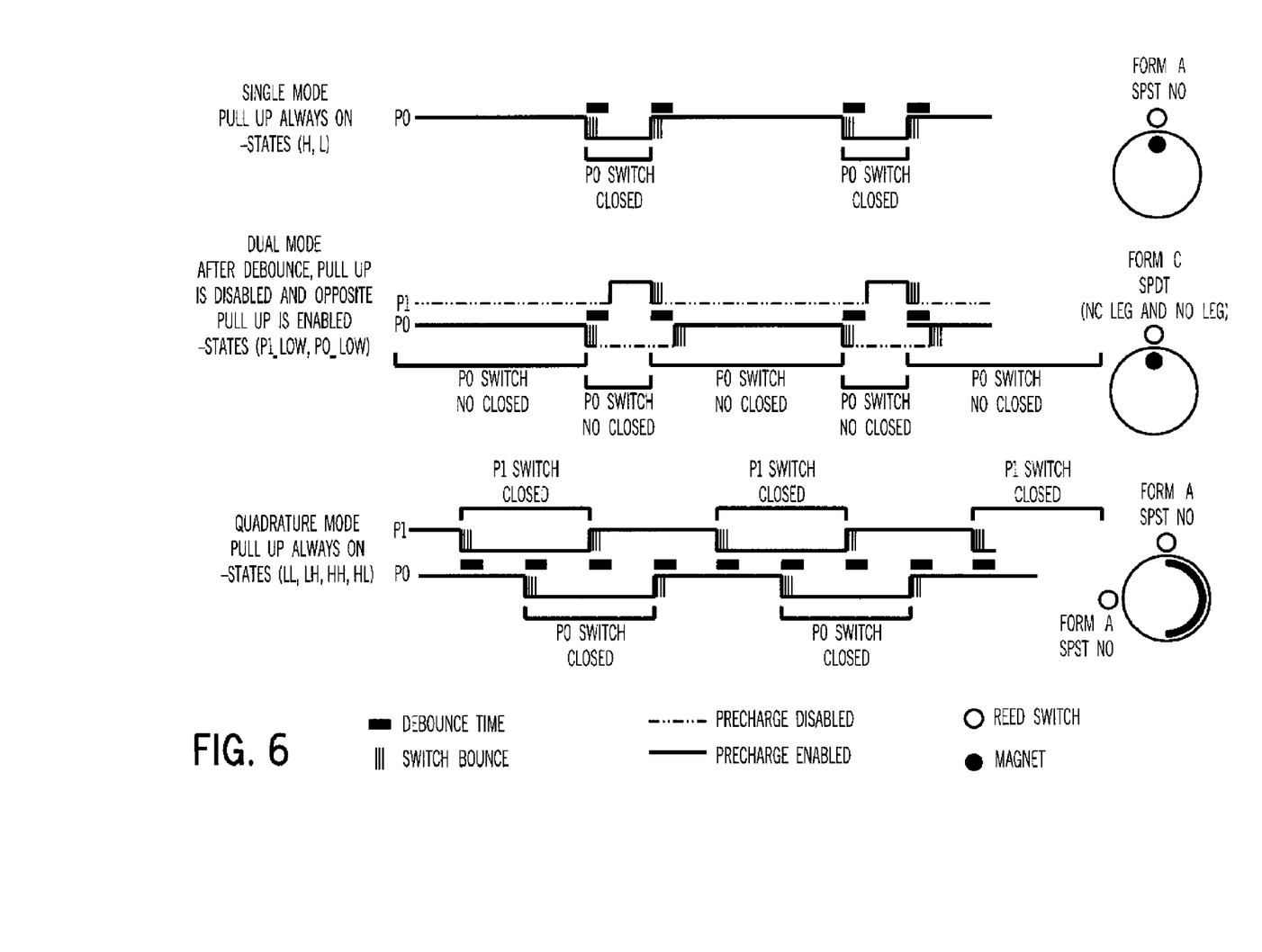
FIG. 6 are timing diagrams for supported modes of operation of a metering system in accordance with an embodiment of the present invention.

Referring now to FIG. 6, shown are timing diagrams for supported modes of operation of a metering system in accordance with an embodiment of the present invention. As shown in FIG. 6, such supported modes include a single mode, a dual mode, and a quadrature mode. With regard to the single mode, a single output signal is received from a switch. This signal may be of a normally high level. That is, for a form A switch with a normally open configuration, when a magnet associated with a metering wheel does not closely align with a switch, the switch remains normally open, and due to the presence of a pull up circuit that is always on, the output signal, P0, is normally high. When the switch closes when the magnet is in close relation to the switch, a path to ground through the switch exists such that the output signal is of a low level. Note in FIG. 6 that switch bouncing can occur for a short time. Accordingly, there is a debounce time such that determination of a level of the output signal is held until after the debounce time to enable a proper reading. Details of a debounce circuit in accordance with an embodiment of the present invention are discussed further below.

As to the dual mode, two output signals are provided. Here, pull up circuits associated with each output line may be controllably enabled and disabled. That is, after a debounce time occurs when the P0 signal goes to a low state (when its normally open leg closes), the pull up circuit associated with the P0 output line is disabled and the pull up circuit associated with the other (P1) output signal line is enabled, causing output signal P1 to transition from a low level to a high level.

As to a quadrature mode using multiple form A switches, the pull up circuits may always remain on. As with the other modes, the presence of debounce times can avoid switch bouncing events so that measurements of the signal levels can be properly performed.

Various debouncing approaches may be used to perform debounce. In some implementations, an integrator may be provided as part of the debounce circuitry, such that a number of logic levels of a given state can be counted before that logic level is output from the integrator (when a debounce period concludes). For example, a digital integrator may be configured such that it counts a predetermined number of samples, e.g., based on a debounce time period (which may be controlled via a configuration setting). When a given number of the samples are, e.g., a low state, the integrator may, at the end of the sample period output a logic low level to downstream circuitry (e.g., a state machine for the given mode of operation) to indicate the signal level on the output line. The digital integrator may be programmable, so that a predetermined count of logic values of a given state may cause a valid detection event. Where flutter is at a higher frequency than the noise, to provide for filtering of flutter of the switch signals, the integrators may have asymmetric up/down counts, This implementation thus performs as an integrator/low pass filter. In some embodiments, a debounce period may be between approximately 1-4 milliseconds. In other implementations, another digital approach, or a digital approach with an integrator reset may be realized. In yet other implementations, a counter-based debounce mechanism may be provided such that a consecutive count of the output signal at a given level occurs before the debounce period ends. In general, the debounce time may be controlled based on configuration settings. In addition to debounce times, many other features of a pulse counter architecture can be controlled based on configuration settings.

In some implementations, multiple control registers may be provided within control circuitry to enable various configuration settings. Such configuration settings may include setting the strength of pull up circuits, debounce times, and pulse counter modes, in addition to pulse counter control. That is, in addition to the pulse counter modes discussed above, additional configuration settings may be provided to control operation within a given mode. Similarly, configuration settings can control, in a quadrature mode, whether a change in wheel direction (e.g., counter-clockwise movement) causes the pulse counter to count in the opposite direction. For example, in an implementation with a decrementing primary counter which decrements its count per clockwise revolution, control settings can enable an increment on counter-clockwise revolution, or can simply hold the current count on counter-clockwise revolution. Similarly, with regard to a backflow counter, which in one embodiment may decrement on counter-clockwise movement, the counter can be configured to be loaded with a preload value on any clockwise revolution, or can be controlled to hold its value on clockwise revolution. Additional registers may be present to provide control information such as various flags that can occur when an end of a counter range is reached. For example, counter flags can be set when a zero value is reached. In addition, an interrupt or enable flag can also be set at this time.

With regard to the counters themselves, as discussed above in many implementations both the primary counter and the secondary counter may be decrementing counters. These counters may be clocked with a relatively low frequency clock signal of a real time clock that remains on during operation. The counters may be loaded with default values on system reset and whenever the counters are decremented to their zero value. In one embodiment, configuration registers may hold default values and may load the default values into the counters on reset or for update. Note that these registers may be clocked by a system clock signal that is controlled to normally be off during normal counting operations. That is, the system clock itself may be placed into a sleep state once normal counting operations begin, and begins clocking again when a counter reaches the end of its range (e.g., a zero value). In this way, reduced power consumption can be realized. In other embodiments, instead of configuration registers that store default values, threshold comparators (which can be dynamically programmed) can be provided to enable a comparison between counter output values and such thresholds.

As will be described further below with respect to finite state machines for the various modes of operation, each event that toggles a state machine for single or dual mode operation may decrement this primary counter, while in quadrature operation, each qualified event that moves a quadrature finite state machine in a clockwise direction decrements the counter. In quadrature implementations, the primary counter can be controlled such that if counter-clockwise operation occurs, the counter may be incremented (as discussed above, this increment operation can be disabled by configuration settings).

The secondary counter may be of similar operation. However note that such counter operates in quadrature mode. In one embodiment, this secondary counter may be an 8-bit ripple counter that is clocked by the same clock that clocks the primary counter, as qualified by a valid event. In quadrature operation, each qualified event that causes the quadrature state machine to move in a counter-clockwise direction decrements the counter, while movement in the state machine in a clockwise direction may cause preloading the counter. Note that in some implementations this preload on clockwise operation can be disabled.

Figure 7A:
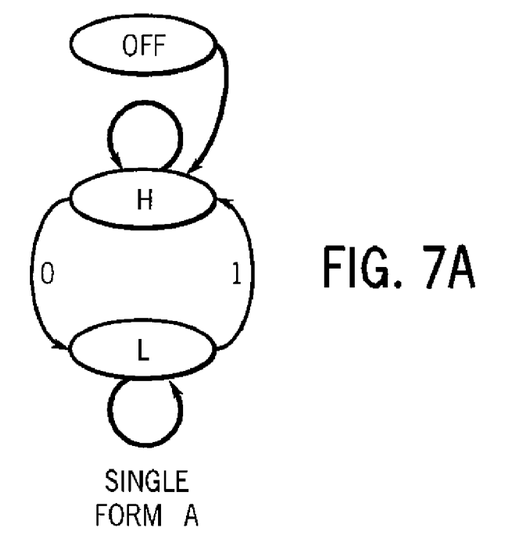
FIGS. 7A and 7B are logic diagrams for state machines for operation in first and second modes in accordance with one embodiment of the present invention.
Figure 7B:
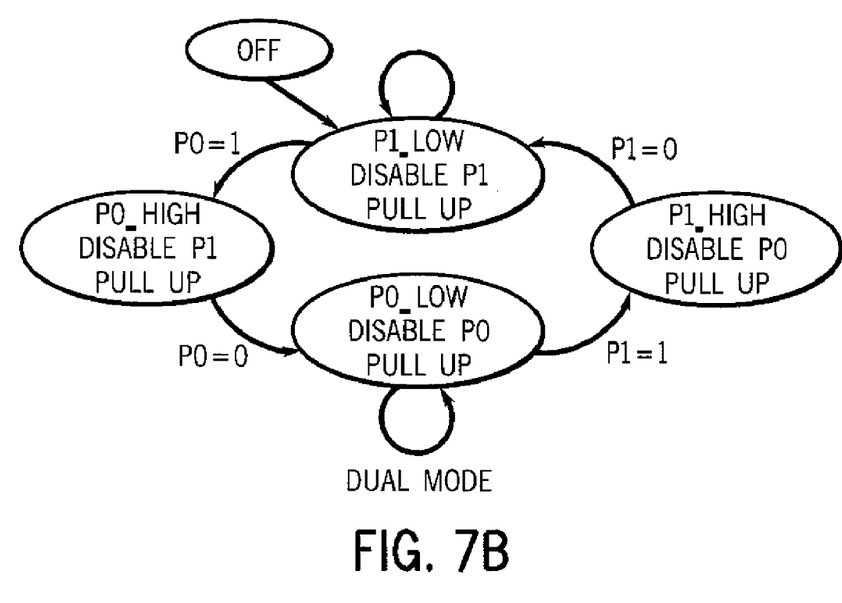

Referring now to FIG. 7A, shown is a logic diagram for a finite state machine for operation in a first mode. This and other state machines may be configured to operate responsive to input of one or more signals from an integrator which outputs a logic level present on the output lines, after a debounce time passes. The state machine may be implemented in hardware, software, or firmware, and in some embodiments may be implemented via logic circuitry to provide control signals to the counters based on incoming logic states. Specifically, FIG. 7A shows operation for a single mode operation. When a toggle event occurs in this state machine (and more specifically when the logic level of the signal output from the integrator transitions to a low state), the primary counter may be decremented accordingly. Similarly, FIG. 7B shows a logic diagram for a finite state machine for operation in a second mode. Specifically, FIG. 7B shows operation for a dual mode. When a toggle event occurs in this state machine, switching of which pullup circuit is enabled (disabled) occurs, and the primary counter may be decremented when the transition of the P0 signal (from the first detector output) is from the logic high to logic low state.

Figure 7C:
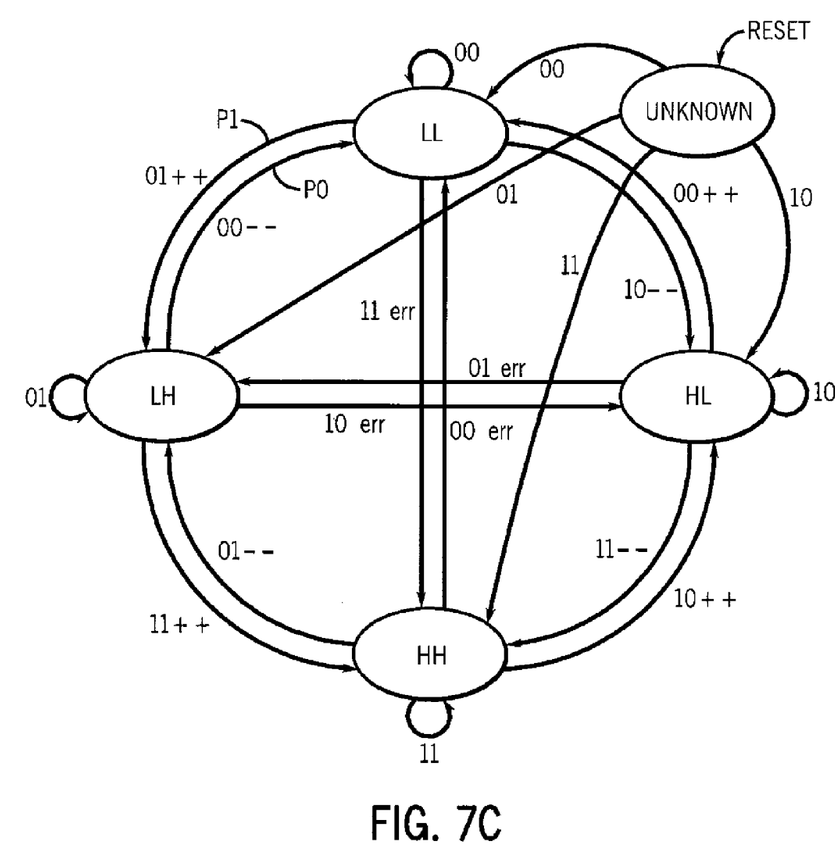
FIG. 7C is a logic diagram for a state machine for operation in a third mode in accordance with yet another embodiment of the present invention.

Referring now to FIG. 7C, shown is a logic diagram for a state machine in accordance with yet another embodiment of the present invention. As shown in FIG. 7C, a quadrature state machine is provided. In addition to normal clockwise or counter-clockwise operation based on the direction of flow through a metering wheel, the state machine also provides for error conditions to be reported when an unexpected transition occurs from one state to another. That is, if the signals input to the metering circuit cause a transition from an LH state to an HL state, an error is detected and reported. As seen in this logic diagram, clockwise travel occurs when an LH-LL, LL-HL, HL-HH, or HH-LH transition is detected. Counter-clockwise travel occurs when transitions from HL-LL, LL-LH, LH-HH, or HH-HL happen. Note with regard to all of these states, the first value corresponds to P1 and the second value corresponds to P0 (with reference back to FIG. 2). As described above, clockwise transition in this state machine causes a decrement to the primary counter (and either a hold or reset of the secondary counter) and counter-clockwise transition in this state machine causes an increment (or hold) to the primary counter (and a decrement of the second counter).

Figure 8:
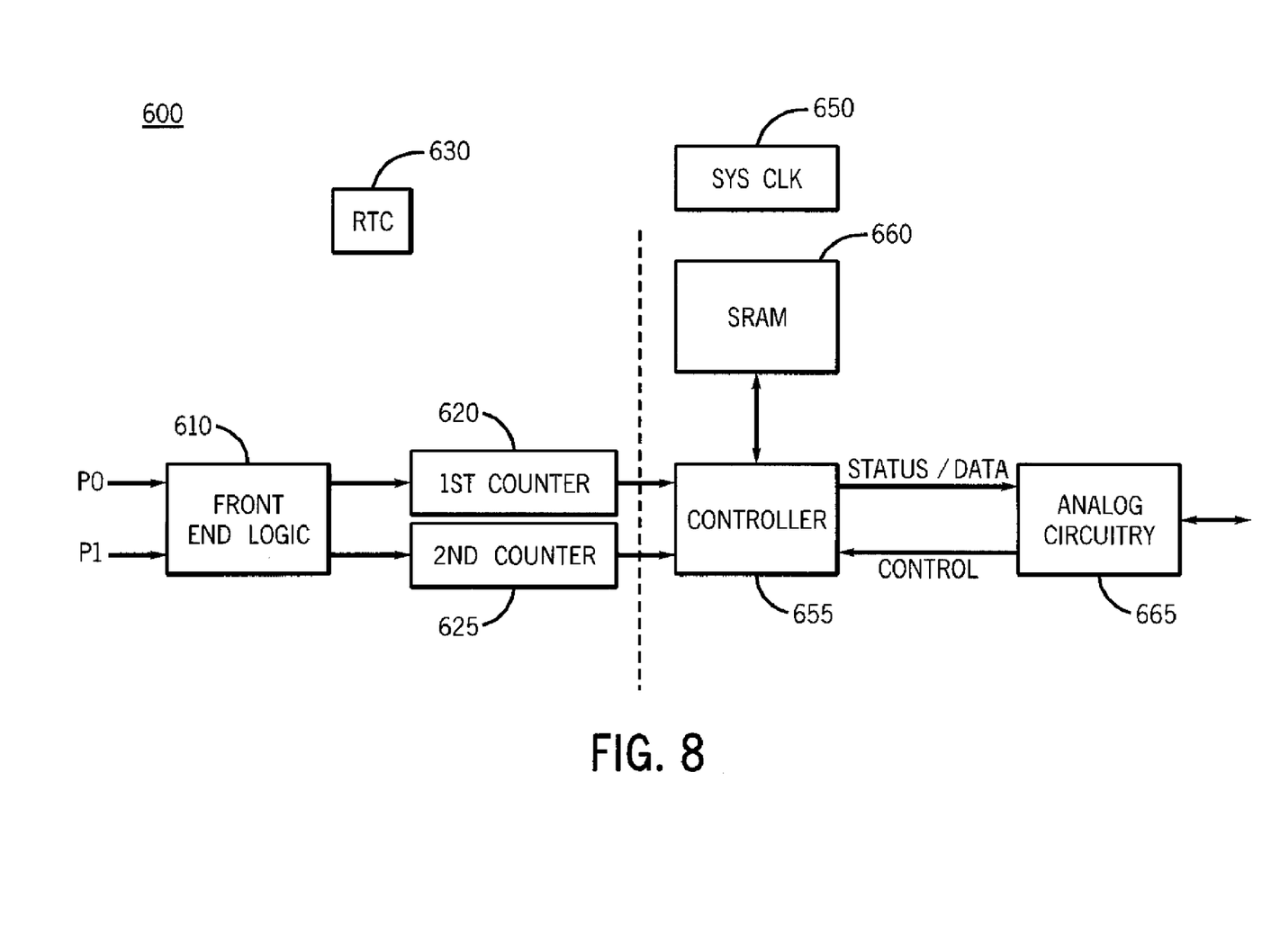
FIG. 8 is a block diagram of a metering circuit in accordance with one embodiment of the present invention.

As described above, pulse metering circuitry such as a single die metering circuit can be implemented for low power operation. To this end, the circuit may include multiple clock domains, including a first domain that may be enabled during normal operation, and a second domain, which may typically be disabled during normal counting operations. Referring now to FIG. 8, shown is a block diagram of a metering circuit in accordance with one embodiment of the present invention. As shown in FIG. 8, circuit 600 may be implemented as a CMOS die, and may include a first clock domain that has a real time clock (RTC) 630 that may operate at a relatively low frequency, e.g., 4 kHz. As seen, this clock domain includes front end logic 610 which may implement the Schmitt triggers, debounce circuitry, state machine logic, and so forth. The outputs of the front end logic may be provided as control signals to first and second counters 620 and 625. In turn, when either of these counters reaches the end of its range, a wake up signal can be sent from the first domain to a second clock domain, which is controlled by a system clock 650, which may be at a relatively higher rate, e.g., 25 MHz. However, note that in normal operation before one of the counters reaches its endpoints, this clock and its associated circuitry may be powered off.

On receipt of one of the signals from a given counter indicating end of range, controller 655 may perform various operations. For example, for end of range of the first counter, controller 655 may update a stored value, which may be stored in a static random access memory (SRAM) 660. This value may correspond to a number of resets of the first counter since a last reporting of a metering value from circuit 600. If instead the wake up event is due to the end of range of the second counter, controller 655 may initiate a backflow alarm. As seen, controller 655 is in communication with analog circuitry 665 which in turn may be coupled to off-die circuitry, such as a radio die. In this way, metering and alarm information can be sent from circuit 600 to the radio circuit, and in turn, control information may be received in controller 655. For example, to perform a read operation when a vehicle of a metering agent of a gas or water company is in proximity to the metering circuit, a control signal may be sent to controller 655 to enable reading of the stored value stored in SRAM 660 and to report this and other status information to the vehicle through analog circuitry 665 and an associated radio die. While shown with this particular implementation in the embodiment of FIG. 8, understand the scope of the present invention is not limited in this regard.

Figure 9:
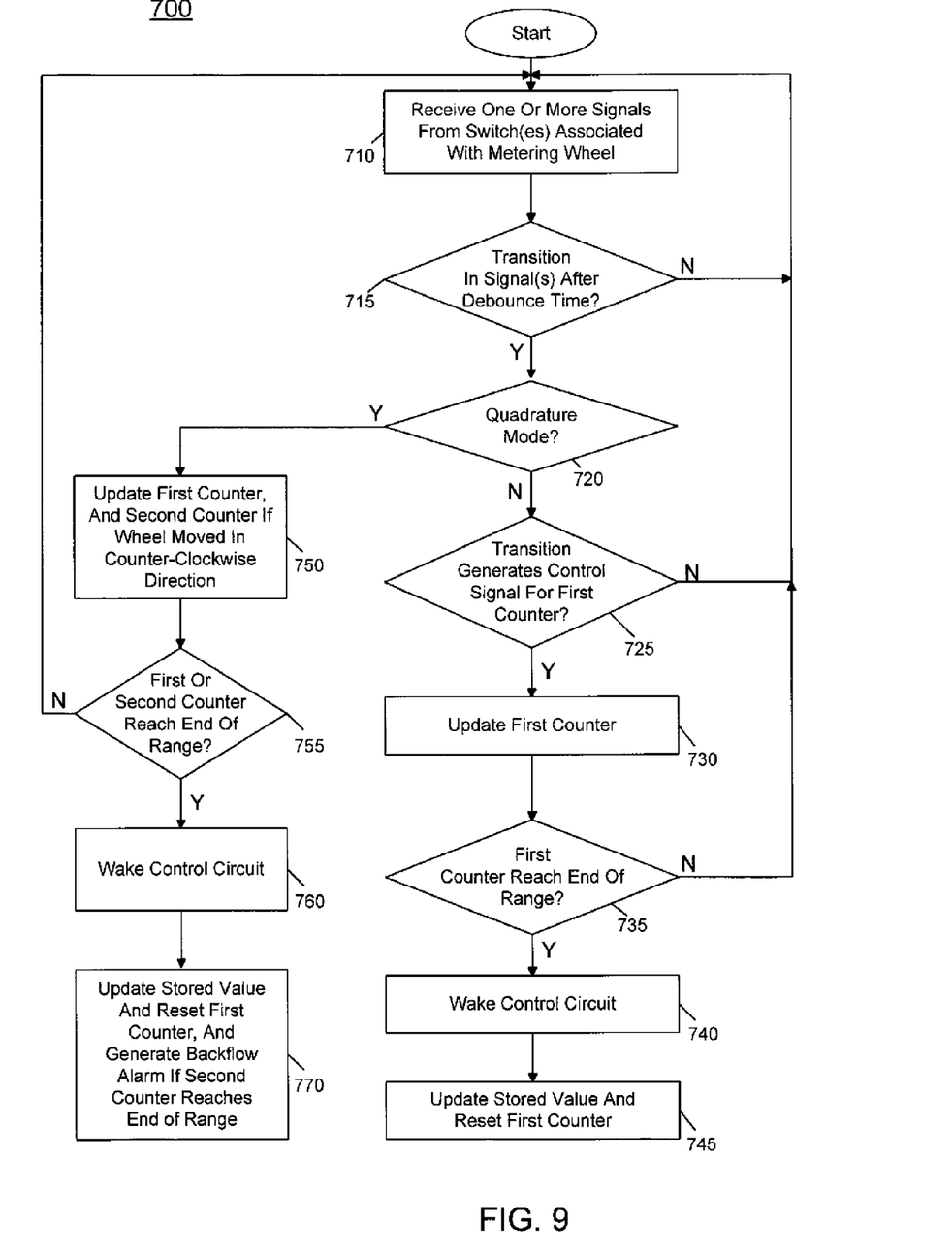
FIG. 9 is a flow diagram of a method in accordance with one embodiment of the present invention.

Referring now to FIG. 9, shown is a flow diagram of a method in accordance with one embodiment of the present invention. In general, method 700 may be implemented within metering circuitry to enable updating of one or more counters and waking up of control circuitry of the metering circuitry when a counter reaches its limit. As seen, method 700 may begin by receiving one or more signals from one or more switches associated with a metering wheel (block 710). Such signals may be as those described above with regard to the modes of operation shown in FIG. 6. After a debounce time, it may then be determined whether any signals have transitions (diamond 715). If so, and operation is not in quadrature mode (determined at diamond 720), control passes to diamond 725 where it may be determined whether the transition generates a control signal for the first counter. That is, a state machine for the operative mode may determine whether the transition should generate a control signal. If so, the control signal is output and accordingly the first counter is updated (block 730). Next, it may be determined whether the first counter has reached the end of its range (diamond 735). If so, a signal is sent from the counter circuitry to wake a control circuit (block 740). Accordingly, at this time, the control circuit may update a stored value corresponding to a number of times that the counter has reached its end value. Furthermore, the control circuitry may reset the first counter (block 745). At this time, normal counting operations may again continue and the control and related circuitry may reenter a sleep state.

If instead quadrature mode is determined to be in operation, control passes to block 750, where the first counter may be updated accordingly (e.g., decrement or increment, depending on whether the transition indicates clockwise or counter-clockwise direction). Furthermore, if a counter-clockwise transition occurs, the second counter may also be updated. From block 750, control passes to block 755, where it may be determined whether the first or second counter has reached the end of its range (diamond 755). If so, a signal is sent from the counter circuitry (e.g., a wake circuit associated with the counters) to wake a control circuit (block 760). On a first counter signal, the control circuit may update a stored value corresponding to a number of times that the first counter has reached its end value. Furthermore, the control circuitry may reset the first counter (block 770). At this time, normal counting operations may again continue and the control and related circuitry may reenter a sleep state. If it is the second counter that reaches its limit, instead a backflow alarm may be generated and communicated, e.g., to the radio device for wireless communication. Of course, other embodiments are possible. For example, in an embodiment with two switches, it can be detected when one switch stops toggling, indicating an error with that switch. In this instance, an error flag can be set that wakes up the control circuit. Such implementations can be used in quadrature or dual modes where the dual pull ups are on all the time. Yet another implementation may be for a dual mode system that has two form C switches with no pull ups.

Figure 10:
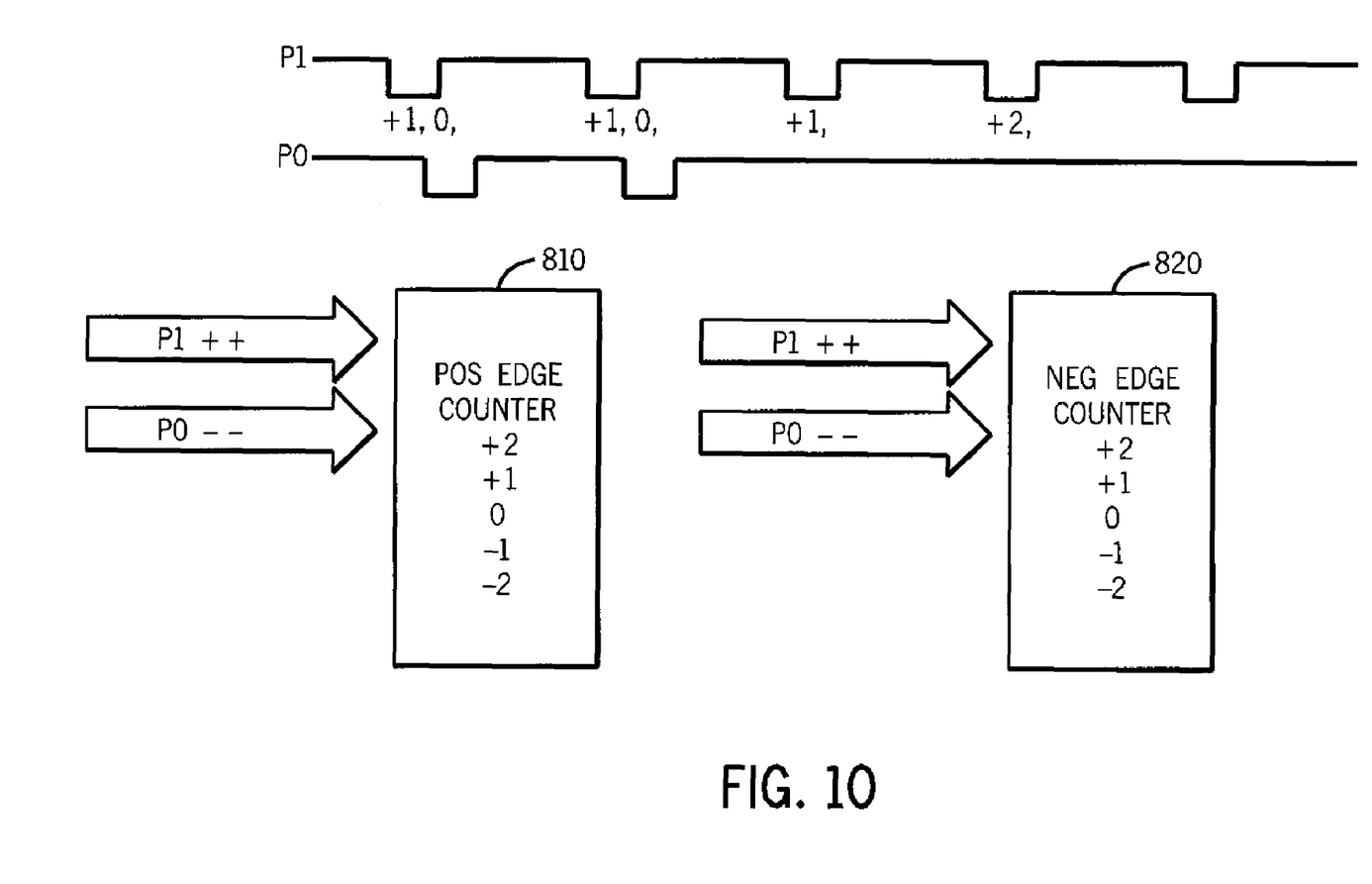
FIG. 10 is a block diagram of pulse streams originating from two switches in accordance with one embodiment of the present invention.

Referring now to FIG. 10, shown are pulse streams originating from two switches in accordance with one embodiment of the present invention. The lower pulse stream (P0) stops when its corresponding switch breaks or flutter occurs. In this embodiment, a first counter 810 can be configured as a positive edge counter such that it increments with positive edges from a first switch and decrements with positive edges from a second switch. In turn, a second counter 820 can be configured as a negative edge counter such that it increments with negative edges from the first switch and decrements with negative edges from the second switch. If either of these counters saturate (e.g., at +2 or −2), an error flag may be set to wake up the controller to indicate a broken reed switch or flutter on the line. Thus this circuitry may detect the case of unequal counts on P0 and P1 which may indicate flutter or a broken reed switch. In addition, a history register may be provided to store the most recent direction of each of the switch outputs, by storing of a value to the register for every edge of one of the switch outputs such that flutter can be identified.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first detector to receive a first signal from a first switch configured to open and close based on position of a metering wheel associated with a flow line;
   a second detector to receive a second signal from a second switch configured to open and close based on the metering wheel position;
   a first counter to count within a first predetermined range based on a change in a state of at least one of the first and second signals that indicates movement of the metering wheel in a first direction; and
   a second counter to count within a second predetermined range based on a change in the state that indicates movement of the metering wheel in a second direction, wherein usage and direction of a fluid or gas flowing along the flow line is based on counts of the first and second counters.

2. The apparatus of claim 1, wherein the first counter is programmed to count in a first direction when the flow direction is forwards and to count in an opposite direction when the flow direction is backwards.

3. The apparatus of claim 2, wherein the second counter is to count only when the flow direction is backwards.

4. The apparatus of claim 1, further comprising a wake circuit to cause a controller to wake up when at least one of the first and second counters reaches an end of the corresponding predetermined range.

5. The apparatus of claim 4, wherein the controller increments a stored value to update a consumption level of the fluid or gas when the first counter reaches the first predetermined range end and to reset the first counter to a beginning of the first predetermined range, and thereafter enters a sleep state.

6. The apparatus of claim 1, further comprising a first pull up circuit coupled to the first detector, the first pull up circuit controllable to provide a pull up impedance between a first voltage node and the first detector, wherein the first pull up circuit can be disabled to reduce power consumption of the apparatus.

7. The apparatus of claim 6, wherein a value of the pull up impedance is set based on a calibration in which a maximum pull up impedance is tested, and then a line coupled to the first detector is discharged and charged using a selected pull up impedance and a current is determined, and wherein the discharging, charging and current determination is sequentially performed until a lowest strength pull up impedance that provides a predetermined current level within a predetermined time period is selected.

8. The apparatus of claim 1, further comprising debounce circuitry coupled between the first detector and the first counter, wherein the debounce circuitry includes a programmable integrator to enable a level detection of the first signal if a predetermined number of samples of the first signal at a first level have occurred during a sample period.

9. The apparatus of claim 1, wherein the apparatus comprises an integrated circuit having a first die including the first and second detectors and the first and second counters, and a second die including a radio circuit to couple with an antenna to wirelessly communicate information received from the first die.

10. The apparatus of claim 1, wherein the second counter is disabled when the apparatus is in a single or dual mode and enabled when the apparatus is in a quadrature mode.

11. A method comprising:
    receiving a first signal in a metering circuit from a first switch associated with a metering wheel associated with a flow line;
    determining, in the metering circuit, whether the first signal has transitioned from a first state to a second state; and
    updating a first count of the metering circuit within a first predetermined range responsive to a first control signal received from a state machine for an operation mode of the metering circuit, the first control signal based at least in part on the transition.

12. The method of claim 11, further comprising:
    sending a wake up signal to a control circuit to wake the control circuit when the first count has reached an end of the first predetermined range.

13. The method of claim 12, further comprising updating a stored value to reflect that the first count has reached the end of the first predetermined range and resetting the first count to a beginning of the first predetermined range, and thereafter disabling the control circuit.

14. The method of claim 11, further comprising:
    receiving a second signal in the metering circuit from a second switch associated with the metering wheel;
    determining, in the metering circuit, whether the second signal has transitioned from a first state to a second state; and updating the first count in a first direction if the transition in at least one of the first and second signals indicates clockwise movement of the metering wheel, and otherwise not updating the first count if the transition indicates counter-clockwise movement of the metering wheel.

15. The method of claim 14, further comprising updating a second count if the transition indicates counter-clockwise movement of the metering wheel.

16. The method of claim 11, further comprising outputting a first control signal from a programmable integrator coupled to the first switch if a predetermined number of samples of the first signal at a first level have occurred during a sample period.

17. The method of claim 11, further comprising sending a first disable signal from the state machine to a first pull up circuit coupled to a first detector that receives the first signal based on a state of the first signal, the first pull up circuit controllable to provide a pull up impedance between a first voltage node and the first detector when not disabled by the first disable signal.

18. A system comprising:
a metering circuit including a first detector to receive a first signal from a first switch configured to open and close based on position of a metering wheel associated with a flow line and to output a first detection signal, a logic unit to receive the first detection signal, to generate a first control signal based on a state of the first detection signal, and to provide the first control signal to a first counter to update a first count within a first predetermined range responsive to the first control signal, and a controller to update a metering count when the first counter reaches an end of the first predetermined range, the metering count corresponding to an amount of fluid or gas that has flowed through the flow line; and
a radio circuit coupled to the metering circuit, the radio circuit to communicate control information to the metering circuit and to receive metering information from the metering circuit, the metering information including the metering count, wherein the radio circuit is to couple to an antenna to enable wireless transmission of at least some of the metering information.

19. The system of claim 18, wherein the metering circuit further includes a second detector to receive a second signal from a second switch configured to open and close based on the metering wheel position and to output a second detection signal, and a second counter, wherein the second counter counts within a second predetermined range responsive to a second control signal generated by the logic unit based on a change in state of at least one of the first and second detection signals.

20. The system of claim 19, wherein the metering circuit further includes:
a third counter to be incremented on a first edge of the first control signal and to be decremented on a first edge of the second control signal;
a fourth counter to be incremented on a second edge of the first control signal and to be decremented on a second edge of the second control signal; and
a third detector to detect flutter or an error in the first or second switch based on a count of at least one of the third and fourth counters.

21. The system of claim 18, wherein the system comprises a meter device including a first semiconductor die having the metering circuit and a second semiconductor die having the radio circuit.

* * * * *